US011436384B2

(12) United States Patent
Lafreniere et al.

(10) Patent No.: US 11,436,384 B2
(45) Date of Patent: Sep. 6, 2022

(54) COMPUTER-AIDED TECHNIQUES FOR ITERATIVELY GENERATING DESIGNS

(71) Applicant: AUTODESK, INC., San Rafael, CA (US)

(72) Inventors: Benjamin Lafreniere, Toronto (CA); Tovi Grossman, Toronto (CA); Ariel Weingarten, San Diego, CA (US); George Fitzmaurice, Toronto (CA)

(73) Assignee: AUTODESK, INC., San Rafael, CA (US)

( * ) Notice: Subject to any disclaimer, the term of this patent is extended or adjusted under 35 U.S.C. 154(b) by 0 days.

(21) Appl. No.: 16/257,008

(22) Filed: Jan. 24, 2019

(65) Prior Publication Data

US 2020/0242201 A1 Jul. 30, 2020

(51) Int. Cl.
  *G06F 30/00* (2020.01)
  *G06T 19/20* (2011.01)
  *G06T 19/00* (2011.01)

(52) U.S. Cl.
  CPC ............ *G06F 30/00* (2020.01); *G06T 19/006* (2013.01); *G06T 19/20* (2013.01); *G06T 2219/2004* (2013.01)

(58) Field of Classification Search
  CPC ....... G06F 30/00; G06T 19/006; G06T 19/20; G06T 2219/2004
  See application file for complete search history.

(56) References Cited

U.S. PATENT DOCUMENTS

| 6,552,721 B1 * | 4/2003 | Ishikawa | G06F 3/14 345/418 |
| 6,618,851 B1 * | 9/2003 | Zundel | G06F 30/00 717/103 |
| 6,629,065 B1 * | 9/2003 | Gadh | G06F 30/17 703/1 |

(Continued)

OTHER PUBLICATIONS

Anderson et al., "Augmented space planning: Using procedural generation to automate desk layouts", https://doi.org/10.1177/1478077118778586, International Journal of Architectural Computing, vol. 16, No. 2, 2018, pp. 164-177.

(Continued)

*Primary Examiner* — Yu Chen
(74) *Attorney, Agent, or Firm* — Artegis Law Group, LLP (57) ABSTRACT

In various embodiments, a generative design application iteratively generates designs via a generative design process. In operation, the generative design application performs one or more layout operations on virtual objects based on a first set of design constraints to generate a first design. The generative design application then modifies the first set of design constraints based on feedback associated with a mid-air representation of the first design displayed in a virtual reality environment to generate a second set of design constraints. Subsequently, the generative design application performs one or more layout operations on the virtual objects based on the second set of design constraints to generate a second design that achieves design goal(s). Advantageously, enabling a designer to incrementally indicate design goal(s) as constraints via a virtual reality environment instead of as a predetermined objective function reduces both the time and effort required to generate designs.

20 Claims, 4 Drawing Sheets

(56) References Cited

U.S. PATENT DOCUMENTS

| | | | | |
|---|---|---|---|---|
| 8,878,846 | B1* | 11/2014 | Francis, Jr. | G06T 19/006 345/420 |
| 9,996,974 | B2* | 6/2018 | Reisner-Kollmann | G06T 17/00 |
| 10,049,493 | B1* | 8/2018 | Verizzo | G06F 3/011 |
| 2004/0085335 | A1* | 5/2004 | Burlnyk | G06F 3/04815 715/716 |
| 2009/0100366 | A1* | 4/2009 | Fitzmaurice | G06T 15/20 715/767 |
| 2010/0185529 | A1* | 7/2010 | Chesnut | G06Q 30/00 705/26.1 |
| 2010/0289817 | A1* | 11/2010 | Meier | G06T 19/006 345/619 |
| 2011/0205242 | A1* | 8/2011 | Friesen | A43B 3/0078 345/633 |
| 2012/0078581 | A1* | 3/2012 | Mattson | G06F 30/17 703/1 |
| 2013/0080121 | A1* | 3/2013 | Gibson | G06F 30/17 703/1 |
| 2013/0318479 | A1* | 11/2013 | Porwal | G06F 3/011 715/849 |
| 2015/0130790 | A1* | 5/2015 | Vasquez, II | G06T 19/006 345/419 |
| 2015/0356774 | A1* | 12/2015 | Gal | G06F 30/00 345/633 |
| 2017/0132841 | A1* | 5/2017 | Morrison | G06K 9/00671 |
| 2017/0220105 | A1* | 8/2017 | Ogata | G06F 3/012 |
| 2017/0287218 | A1* | 10/2017 | Nuernberger | G06T 19/006 |
| 2018/0197340 | A1* | 7/2018 | Loberg | G06F 3/04845 |
| 2018/0374276 | A1* | 12/2018 | Powers | G06T 15/10 |
| 2019/0155481 | A1* | 5/2019 | DiVerdi | G06F 3/014 |
| 2019/0378340 | A1* | 12/2019 | Chia | G06F 3/04815 |

OTHER PUBLICATIONS

Chang et al., "ShapeNet: An Information-Rich 3D Model Repository", arXiv:1512.03012, http://arxiv.org/abs/1512.03012, 2015, pp. 1-11.

Chen et al., "Forte: User-Driven Generative Design", https://doi.org/10.1145/3173574.3174070, In Proceedings of the 2018 CHI Conference on Human Factors in Computing Systems (CHI '18), Apr. 21-26, 2018, pp. 496:1-496:12.

Deterding et al., "Mixed-Initiative Creative Interfaces", https://doi.org/10.1145/3027063.3027072, In Proceedings of the 2017 CHI Conference Extended Abstracts on Human Factors in Computing Systems (CHI EA '17), May 6-11, 2017, pp. 628-635.

Dow et al., "Parallel Prototyping Leads to Better Design Results, More Divergence, and Increased Self-Efficacy", https://doi.org/10.1145/1879831.1879836, ACM Transactions Comput.-Hum. Interact, vol. 17, No. 4, Article 18, Dec. 2010, pp. 18:1-18:24.

Gaver et al., "Alternatives: Exploring Information Appliances Through Conceptual Design Proposals", https://doi. org/10.1145/332040.332433, In Proceedings of the SIGCHI Conference on Human Factors in Computing Systems (CHI '00), vol. 2, No. 1, Apr. 1-6, 2000, pp. 209-216.

Hartmann et al., "Reflective Physical Prototyping through Integrated Design, Test, and Analysis", https://doi.org/10.1145/1166253.1166300, In Proceedings of the 19th Annual ACM Symposium on User Interface Software and Technology (UIST '06), Oct. 15-18, 2006, pp. 299-308.

Hartmann et al., "Design as Exploration: Creating Interface Alternatives through Parallel Authoring and Runtime Tuning", https://doi.org/10.1145/1449715.1449732, In Proceedings of the 21st annual ACM symposium on User Interface software and technology—UIST '08, Oct. 19-22, 2008, pp. 91-100.

Kazi et al., "DreamSketch: Early Stage 3D Design Explorations with Sketching and Generative Design", https://doi.org/10.1145/3126594.3126662, In Proceedings of the 30th Annual ACM Symposium on User Interface Software and Technology—UIST '17, Oct. 22-25, 2017, pp. 401-414.

Klemmer et al., "How Bodies Matter: Five Themes for Interaction Design", https://doi.org/10.1145/1142405.1142429, In Proceedings of the 6th Conference on Designing Interactive Systems (DIS '06), Jun. 26-28, 2006, pp. 140-149.

Lunzer et al., "Subjunctive Interfaces: Extending Applications to Support Parallel Setup, Viewing and Control of Alternative Scenarios", https://doi.org/10.1145/1314683.1314685, ACM Transactions on Computer-Human Interaction, vol. 14, No. 4, Article 17, Jan. 2008, pp. 17:1-17:44.

Matejka et al., "Dream Lens: Exploration and Visualization of Large-Scale Generative Design Datasets", https://doi.org/10.1145/3173574.3173943, In Proceedings of the 2018 CHI Conference on Human Factors in Computing Systems—CHI '18, Apr. 21-26, 2018, pp. 369:1-369:12.

Merrell et al., "Interactive Furniture Layout Using Interior Design Guidelines", https://doi.org/10.1145/1964921.1964982, ACM Transactions on Graphics, vol. 30, No. 4, Article 87, Jul. 2011, pp. 87:1-87:10.

Nourbakhsh et al., "Embedded Sensors and Feedback Loops for Iterative Improvement in Design Synthesis for Additive Manufacturing", https://doi.org/10.1115/DETC2016-59627, V01AT02A031-V01AT02A031, Aug. 21-24, 2016, pp. 1-9.

O'Donovan et al., "DesignScape: Design with Interactive Layout Suggestions", https://doi.org/10.1145/2702123.2702149, In Proceedings of the 33rd Annual ACM Conference on Human Factors in Computing Systems (CHI '15), Apr. 18-23, 2015, pp. 1221-1224.

Rhodes, Margaret, "So. Algorithms Are Designing Chairs Now", WIRED, Oct. 3, 2016, https://www.wired.com/2016/10/elbo-chair-autodesk-algorithm/, 8 pages.

Shea et al., "Towards integrated performance-driven generative design tools", doi:10.1016/j.autcon.2004.07.002, Automation in Construction, vol. 14, No. 2, 2005, pp. 253-264.

Siangliulue et al., "IdeaHound: Improving Large-scale Collaborative Ideation with Crowd-Powered Real-time Semantic Modeling", https://doi.org/10.1145/2984511.2984578, In Proceedings of the 29th Annual Symposium on User Interface Software and Technology (UIST '16), Oct. 16-19, 2016, pp. 609-624.

Smith et al., "Tanagra: A Mixed-Initiative Level Design Tool", https://doi.org/10.1145/1822348.1822376, In Proceedings of the Fifth International Conference on the Foundations of Digital Games—FDG '10, Jun. 19-21, 2010, pp. 209-216.

BeLight Software, "Live Home 3D—Home Design Software for Mac", www.livehome3d.com, retrieved Apr. 3, 2020 from http://www.livehome3d.com/mac/live-home-3d, 24 pages.

Stoakley et al., "Virtual Reality on a WIM: Interactive Worlds in Miniature", https://doi.org/10.1145/223904.223938, In Proceedings of the SIGCHI Conference on Human Factors in Computing Systems (CHI '95), May 7-11, 1995, pp. 265-272.

Terry et al., "Side Views: Persistent, On-demand Previews for Open-ended Tasks", https://doi.org/10.1145/571985.571996, In Proceedings of the 15th Annual ACM Symposium on User Interface Software and Technology (UIST '02), vol. 4, No. 2, Oct. 27-30, 2002, pp. 71-80.

Terry et al., "Variation in Element and Action: Supporting Simultaneous Development of Alternative Solutions", https://doi.org/10.1145/985692.985782, In Proceedings of the SIGCHI Conference on Human Factors in Computing Systems (CHI '04), vol. 6, No. 1, Apr. 24-29, 2004, pp. 711-718.

Walker et al., "High-Fidelity or Low-Fidelity, Paper or Computer? Choosing Attributes When Festing Web Prototypes", https://doi.org/10.1177/154193120204600513, Proceedings of the Human Factors and Ergonomics Society Annual Meeting, vol. 46, No. 5, 2002, pp. 661-665.

Autodesk, "AIRBUS—Reimagining the Future of Air Travel", retrieved Apr. 3, 2020 from https://www.autodesk.com/customer-stories/airbus, 20 pages.

BIM Toolbox, "Generative Design Applied on Buildings," http://autodesk.typepad.com/bimtoolbox/2017/06/generative-design-applied-on-buildings.html, Jun. 9, 2017, 8 pages.

"Floorplanner—Create 2D & 3D floorplans for real estate, office space or your home", Floorplanner.com, retrieved Apr. 3, 2020 from https://floorplanner.com/, 9 pages.

(56) References Cited

OTHER PUBLICATIONS

"Floor Plan Creator and Designer | Free Online Floor Plan App", SmartDraw, retrieved Apr. 5, 2020 from https://www.smartdraw.com/floor-plan/floor-plan-designer.htm, 9 pages.
"Free 3D Home Planner | Design a House Online: Planner5D", Planner5D, retrieved Apr. 5, 2020 from https://planner5d.com/, 5 pages.
"Planner 5D—Virtual Reality", Planner5D, retrieved Apr. 5, 2020 from https://planner5d.com/vr/, 5 pages.
"Online Interior Design Help & Affordable Decorating Services", Decorilla, retrieved Apr. 5, 2020 from https://www.decorilla.com, 7 pages.
Therese Akesson, "Virtual Reality—Into the Magic", Ikea, retrieved Apr. 14, 2020 from https://www.ikea.com/ms/en_US/this-is-ikea/ikea-highlights/Virtual-reality/, 8 pages.
Jansson et al., "Design fixation", https://doi.org/10.1016/0142-694X(91)90003-F, retrieved from https://www.sciencedirect.com/science/article/pii/0142694X9190003F, vol. 12, No. 1, Jan. 1991, pp. 3-11.
"VRTK—Virtual Reality Toolkit", VRTK, retrieved Apr. 5, 2020 from https://vrtoolkit.readme.io/, 4 pages.

\* cited by examiner

COMPUTER-AIDED TECHNIQUES FOR ITERATIVELY GENERATING DESIGNS

BACKGROUND

Field of the Various Embodiments

Embodiments of the present invention relate generally to computer-aided design software and, more specifically, to computer-aided techniques for iteratively generating designs.

Description of the Related Art

During a typical design process, a designer usually lays out representations of different objects multiple times in order to generate a variety of different designs. Further, this layout process is usually a manual process. For example, a designer could manually position and orient different icons representing different pieces of furniture within an image of a room to generate various designs representing different room layouts. As part of this design process, the designer ensures that each generated design includes desirable features and efficiencies, periodically discarding sub-optimal designs. For example, a designer could ensure that a television is positioned along a north wall in each design and, after reviewing several designs, discard the designs in which a sofa does not face a window or where a viewing location is not located close enough to the television. After generating a sufficient number of designs and culling the sub-optimal designs, the designer usually selects a single final design for implementation or production. In general, as the number of objects to be positioned increases, the time required to generate and evaluate designs also increases. Consequently, the time required to generate and cull relatively complex designs that sufficiently reflect the desired features and efficiencies can be prohibitive.

To reduce the time required to generate and evaluate designs, designers oftentimes use computer-aided design (CAD) applications that implement a process known as generative design when generating and evaluating designs. In generative design, designs are automatically synthesized based on an objective function that expresses any number and type of design goals. In a typical generative design flow, the designer specifies the objective function, and a generative design application then executes a variety of multi-objective optimization algorithms to optimize potential design solutions based on the objective function. This generative design process is an evolutionary process that typically generates a vast number (e.g., tens of thousands) of designs that satisfy the different design goals. The CAD application presents those designs to the designer in the context of a design space. Lastly, the designer explores the "generative" design space, evaluating different designs included in the generative design space, and selects a single final design for implementation or production.

One drawback of generative design is that an objective function that adequately specifies the design goals is usually unavailable during the early "prototyping" stages of the design process. In those early stages, a designer determines which design features are most desirable, determines the design goals based on the most desirable features, and finally generates the objective function specifying the design goals. Determining which design features are most desirable is typically a manual process. For example, the designer could sketch out a variety of prototypes on paper or create mood boards that visually illustrate different prototypes. Subsequently, the designer could visually scrutinize the different prototypes in an effort to identify the most desirable features. However, manually generating and scrutinizing prototypes is time-consuming, tedious, and inefficient, which limits the effectiveness of a generative design approach.

As the foregoing illustrates, what is needed in the art are more effective techniques for generating and evaluating different designs in a design space.

SUMMARY

One embodiment of the present invention sets forth a computer-implemented method for iteratively generating designs via a generative design process. The method includes performing one or more layout operations on virtual objects based on a first set of design constraints to generate a first design; modifying the first set of design constraints based on feedback associated with a mid-air representation of the first design displayed in a virtual reality environment to generate a second set of design constraints; and performing one or more layout operations on the virtual objects based on the second set of design constraints to generate a second design that achieves one or more design goals.

At least one technical advantage of the disclosed techniques relative to prior art solutions is that new designs are automatically generated based on constraints specified in a virtual reality environment that depicts a previously generated design. In particular, enabling a designer to efficiently specify design goals as subjective constraints via mid-air movements performed in the virtual reality environment reduces both the time and effort required for the designer to define the design goals. Further, unlike prior art generative design techniques that require a predetermined objective function specifying the design goals, designs can be generated before the design goals are fully defined. These technical advantages provide one or more technological advancements over the prior art.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

System Overview

Figure 1:
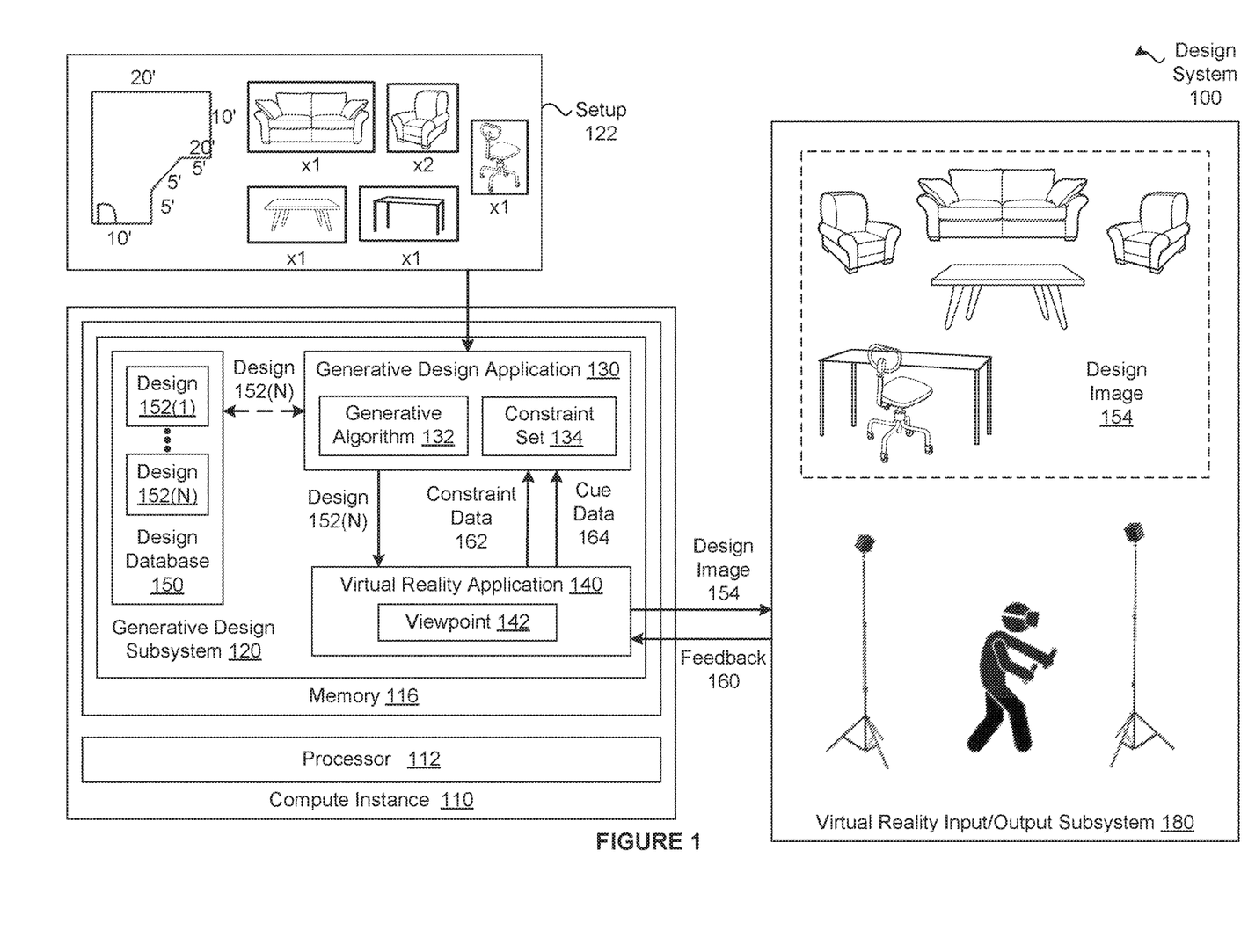
FIG. 1 is a conceptual illustration of a system configured to implement one or more aspects of the present invention.

FIG. 1 is a conceptual illustration of a design system 100 configured to implement one or more aspects of the present invention. As shown, the design system 100 includes, without limitation, a compute instance 110, a virtual reality (VR) input/output subsystem 180, and a setup 122. In alternate embodiments, the design system 100 may include any number of compute instances 110. For explanatory purposes, multiple instances of like objects are denoted with reference numbers identifying the object and parenthetical numbers identifying the instance where needed.

In various embodiments, any number of the components of the design system 100 may be distributed across multiple geographic locations or implemented in one or more cloud computing environments (i.e., encapsulated shared resources, software, data, etc.) in any combination. In alternate embodiments, the design system 100 may include any number of compute instances 110 and any number of VR input/output subsystems 180. Further, in various embodiments, the VR input/output subsystem 180 may be replaced or supplemented with any number and type of input/output subsystems, input subsystems, and output subsystems, in any combination. For instance, in some embodiments, the VR input/output subsystem 180 is replaced with an augmented reality (AR) input/output subsystem. In other embodiments, the VR input output subsystem 180 is supplemented with an input system that includes a keyboard and a mouse and an output system that includes a monitor.

As shown, the compute instance 110 includes, without limitation, a processor 112 and a memory 116. The processor 112 may be any instruction execution system, apparatus, or device capable of executing instructions. For example, the processor 112 could comprise a central processing unit (CPU), a graphics processing unit (GPU), a controller, a microcontroller, a state machine, or any combination thereof. The memory 116 stores content, such as software applications and data, for use by the processor 112 of the compute instance 110. In alternate embodiments, the compute instance 110 may include any number of processors 112 and any number of memories 116 in any combination. In particular, any number of compute instances 110 (including one) may provide a multiprocessing environment in any technically feasible fashion.

The memory 116 may be one or more of a readily available memory, such as random access memory (RAM), read only memory (ROM), floppy disk, hard disk, or any other form of digital storage, local or remote. In some embodiments, a storage (not shown) may supplement or replace the memory 116. The storage may include any number and type of external memories that are accessible to the processor 112. For example, and without limitation, the storage may include a Secure Digital Card, an external Flash memory, a portable compact disc read-only memory (CD-ROM), an optical storage device, a magnetic storage device, or any suitable combination of the foregoing.

The compute instance 110 is configured to implement one or more applications or subsystems of applications. For explanatory purposes only, each application is depicted as residing in the memory 116 of a single compute instance 110 and executing on a processor 112 of the single compute instance 110. However, as persons skilled in the art will recognize, the functionality of each application may be distributed across any number of other applications that reside in the memories 116 of any number of compute instances 110 and execute on the processors 112 of any number of compute instances 110 in any combination. Further, the functionality of any number of applications or subsystems may be consolidated into a single application or subsystem.

In particular, the compute instance 110 is configured to automatically generate designs 152 as part of a design process. Each design 152 represents, without limitation, a layout of any number and type of objects digitally in any technically feasible fashion. More specifically, each design 152 includes, without limitation, the positions and orientations of any number of virtual objects, where each virtual object digitally represents an associated object that may or may not actually exist. For instance, in some embodiments, each of the designs 152 is a layout of pieces of furniture in a physical room. In various embodiments, each of the designs 152 is a layout of a football stadium. In other embodiments, each of the designs 152 represents a layout of an automotive dashboard. In yet other embodiments, each of the designs 152 represents a layout of any number of 3D objects that do not actually exist but are implemented in a video game.

Oftentimes approaches to the design process that involve manually generating and evaluating designs are prohibitively time-consuming. To reduce the time required to generate and evaluate designs, designers oftentimes use computer-aided design (CAD) applications that implement conventional generative design when generating and evaluating designs. In conventional generative design, designs are automatically synthesized based on an objective function that expresses any number and type of design goals. One drawback of conventional generative design is that an objective function that adequately specifies the design goals is usually unavailable during the early "prototyping" stages of the design process. In those early stages, a designer typically generates and evaluates prototypes manually to determine which design features are most desirable, determines the design goals based on the most desirable features, and finally generates the objective function specifying the design goals. In general, manually generating and evaluating prototypes is time-consuming, tedious, and inefficient and, consequently, limits the effectiveness of a conventional generative design approach.

Generating Designs Based on Interactively Specified Constraints

To reduce the time and effort required to generate and evaluate designs when an objective function is unavailable or inadequate, the design system 100 includes, without limitation, a generative design subsystem 120 and the virtual reality input/output subsystem 180. As shown, the generative design subsystem 120 resides in the memory 116 and executes on the processor 112 of the compute instance 110.

For explanatory purposes only, the generative design subsystem 120 is described in the context of an iterative conceptualization and design process for laying out pieces of furniture in a room. More precisely, the functionality of the generative design subsystem 120 is described with respect to interactively positioning and orienting different virtual pieces of furniture within a virtual room to generate the designs 152. However, many modifications and variations will be apparent to those of ordinary skill in the art without departing from the scope and spirit of the described embodiments and techniques. As a general matter, the techniques outlined herein are applicable to any iterative conceptual and design process for laying out any number and virtual objects within any number and type of virtual geometries to generate any type of designs 152.

As shown, the generative design subsystem 120 includes, without limitation, a generative design application 130, a virtual reality application 140, and a design database 150. In operation, the generative design application 130 iteratively generates one design 152 at a time based on a generative algorithm 132 that executes in real-time and a constraint set 134 that changes over time. The virtual reality application 140 interacts with the virtual reality input/output subsystem 180 to continually display a "current" design 152 in mid-air and track mid-air movements performed in association with the displayed design 152. In this fashion, the virtual reality application 140 and the virtual reality input/output subsystem 180 generate a virtual reality environment that enables the designer to explore and interactively constrain a generative design space that is incrementally generated by the generative design application 130.

As shown, the generative design application 130 includes, without limitation, the generative algorithm 132 and the constraint set 134. For explanatory purposes only, the generative design application 130 depicted in FIG. 1 implements a particular generative algorithm 132 that randomly places virtual pieces of furniture within a virtual room subject to three layout rules. The first layout rule is that each virtual piece of furniture is positioned against a wall of the room or an internal boundary specified via a constraint included in the constraint set 134. The second layout rule is that each virtual piece of furniture is positioned such that the virtual piece of furniture does not overlap any other virtual pieces of furniture and any clearance constraints included in the constraint set 134 are respected. The third layout rule is that all constraints included in the constraint set 134 are respected.

The generative algorithm 132 may execute any number and type of layout operations to generate a new design 152 that complies with the layout rules and the constraint set 134. For instance, in some embodiments, the generative algorithm 132 generates a partial design that includes any virtual pieces of furniture that are constrained to a single position and orientation based on the constraint set 134. Subsequently, the generative algorithm 132 randomly assigns a position and orientation to an unplaced virtual piece of furniture and adds the placed virtual piece of furniture to the partial design to generate a potential design.

If the potential design does not comply with the layout rules and constraints, then the generative algorithm 132 randomly assigns a new position and orientation to the first virtual piece of furniture to generate a new potential design. The generative algorithm 132 continues to re-position and re-orient the first virtual piece of furniture in this fashion until the potential design complies with the layout rules and the constraint set 134. When the potential design complies with the layout rules and the constraint set 134, the generative algorithm 132 sets the partial design equal to the potential design.

The generative algorithm then adds another unplaced virtual piece of furniture to the partial design in a similar fashion. The generative algorithm 132 continues to place each unplaced virtual piece of furniture in a random, iterative fashion until there are no unplaced virtual pieces of furniture remaining and that partial design complies with the layout rules and the constraint set 134. The generative algorithm 132 then sets the design 152 equal to the partial design.

In alternate embodiments, the generative algorithm 132 may randomly generate positions and orientations for each of the non-fixed pieces of furniture to generate a potential design. If the potential design does not comply with the layout rules and the constraint set 134, then the generative algorithm 135 discards the potential design and randomly generates a new potential design. The generative algorithm 132 continues to generate and discard potential designs until the generative algorithm 132 randomly generates a potential design that complies with the layout rules and the constraint set 134. The generative algorithm 132 then sets the design 152 equal to the potential design.

In various embodiments, the constraint set 134 may include any number of objective criteria constraints. As referred to herein, an objective criteria constraint specifies a scoring metric. For example, an objective criteria constraint could specify that positioning virtual pieces of furniture that provide seating (e.g., a sofa, a chair, etc) along a northern wall is preferable to placing "seating" along other walls. The objective criteria constraint could further specify that each preferred position adds ten to an overall score, while other positions subtract ten from the overall score.

For each "current" piece of furniture, instead of randomly generating one partial design and then determining whether the partial design complies with the layout rules and the constraint set 134, the generative algorithm 132 randomly generates a set of potential designs (e.g., 10 potential designs). The generative algorithm 132 then scores each of the potential designs based on the objective criteria constraints and selects the potential design having the highest score. If the selected potential design does not comply with the layout rules and the constraint set 134, then the generative algorithm 132 randomly generates a new set of potential designs. Otherwise, the generative algorithm 132 fixes the position of the current piece of furniture and randomly places an unplaced piece of furniture to generate a new set of potential designs.

The constraint set 134 includes, without limitation, any number and type of constraints (not shown) that are relevant to the generative algorithm 132. Examples of constraints include, without limitation, locking constraints, grouping constraints, boundary constraints, clearance constraints, path constraints, etc. A locking constraint specifies a fixed position and orientation for a virtual piece of furniture. A grouping constraint specifies relative positions and orientations for multiple virtual pieces of furniture with respect to one another. After virtual pieces of furniture are grouped together, the generative design application 130 processes the group as a single virtual piece of furniture.

A boundary constraint specifies an internal boundary associated with the designs 152. For example, if the design 152 is a room layout, then a boundary constraint could specify a guide wall along which the generative design application 130 can place pieces of furniture. A clearance constraint specifies a clearance associated with a virtual object within which no other virtual object can be located. A path constraint specifies a path within which no virtual object can be located. For example, a path constraint could specify that no pieces of furniture are to be placed along a two-foot wide linear path between a sofa and a door. In alternate embodiments, a path constraint may be any type of constraint associated with a path.

In operations, the generative design application 130 initially acquires a setup 122. The setup 122 specifies parameters associated with the generative algorithm 132, such as the pieces of furniture, the geometry of the room, and virtual objects (e.g., windows, doors, etc) associated with the room.

For explanatory purposes only, the setup 122 depicted in FIG. 1 specifies that one sofa, two armchairs, one coffee table, one desk, and one desk chair are to be placed in a room having an irregular shape and one door. The setup 122 may be specified and transmitted to the generative design application 130 in any technically feasible fashion. For instance, in some embodiments, the setup 122 is generated in a two-dimensional (2D) or 3D CAD tool and subsequently imported into the generative design application 130.

After acquiring the setup 122, the generative design application 120 initializes the constraint set 134 to the initial constraint set 134 and executes the generative algorithm 132 based on the setup 122 and the constraint set 134. The initial constraint set 134 may include, without limitation, any number (including zero) and type of constraints. For example, the initial constraint set 134 could include one constraint specifying that no two virtual objects can intersect each other and another constraint specifying that each virtual object specified in the setup 122 is to be placed within a virtual room specified in the setup 122. The generative algorithm 132 generates the design 152(1) that complies with the constraint set 134 (i.e., the initial constraint set 134). The generative design application 120 then transmits the design 152(1) to the virtual reality application 140 for display in the virtual reality environment.

As described in greater detail below, based on the feedback 160 associated with actions and movements performed by the designer relative to the design 152(1), the virtual reality application 150 generates constraint data 162 and cue data 164. The constraint data 162 specifies any amount and type of data associated with any number and type of constraints. Upon receiving new constraint data 162, the generative design application 130 modifies the constraint set 134. The generative design application 130 may modify the constraint set 134 in any technically feasible fashion that is consistent with the constraint data 162.

For example, the constraint data 162 could specify that the designer virtually walked between two positions within the room to specify a path constraint. In response, the generative design application 130 could generate a path constraint between the two positions having a clearance width, such as the width of a typical person. In another example, the constraint data 162 could specify that the constraint set 134 is to be re-initialized to the initial constraint set 134. In response, the generative design application 130 could delete any existing constraints and set the constraint set 134 equal to the initial constraint set 134.

As additional constraints are added to the constraint set 134, the entropy associated with the generative process decreases and the generative design space shrinks. Conversely, as constraints are removed from the constraint set 134, the entropy associated with the generative process increases and the generative design space expands. In general, as a designer determines preferred features and design goals, the designer specifies additional constraints that lower the entropy of the generative process. As a result, the designs 152 that are subsequently generated by the generative design application 130 better reflect the preferences of the designer.

The cue data 164 may specify any number and type of requests. For example, the cue data 164 could be a request to generate a new design 152, store the current design 152, restore a previously stored design 152, or terminate the conceptualization and design process. If the cue data 164 is a request to generate a new design 152, then the generative design application 130 discards the current design 152 and generates a new design 152 based on the setup 122 and the constraint set 134.

If the cue data 164 is a request to store the current design 152, then the generative design application 130 stores the current design 152 in the design database 150. The design database 150 includes, without limitation, any number of previously generated designs 152. If the cue data 163 is a request to restore a previously stored design 152(x), then the generative design application 130 replaces the current design 152 with the design 152(x) included in the design database 150. The generative design application 130 then transmits the current design 152 to the virtual reality application 140 for display in the virtual reality environment.

In alternate embodiments, the design database 150 includes, without limitation, any number of previously generated designs 152 and the associated constraint sets 134. In such embodiments, if the cue request 163 is a request to store the current design 152, then the generative design application 130 stores the current design 152(n) along with the current constraint set 134(n) in the design database 150. In a complementary fashion, if the cue request 163 is a request to restore a previously stored design 152(x), then the generative design application 130 replaces the current design 152 with the design 152(x) included in the design database 150 and replaces the current constraint set 134 with the constraint set 134(x) stored in the design database 150. Storing and restoring designs 152 in this fashion enables the designer to explore a first portion of the design space, explore different portion(s) of the design space, return to the first portion of the design space, and continue to explore the first portion of the design space.

As shown, the virtual reality application 140 includes, without limitation, a viewpoint 142. The viewpoint 142 specifies the location and orientation of the designer with respect to the current design 152 within the virtual reality environment. The virtual reality application 140 may initialize the viewpoint 142 in any technically feasible fashion and subsequently may change the viewpoint 142 based on the feedback 160. Upon receiving the current design 152 from the generative design application 130 or changing the viewpoint 142, the virtual reality application 140 generates a design image 154 based on the current design 152 and the viewpoint 142. The virtual reality application then transmits the design image 154 to the virtual reality application 140 for mid-air display. Importantly, the viewpoint 142 may be an absolute viewpoint 142 or a relative viewpoint 142.

An absolute viewpoint 142 specifies a position and orientation for the designer that remains constant irrespective of the displayed design 152. Specifying an absolute viewpoint 142 enables the designer to virtually experience different designs 152 from a fixed vantage point, such as when walking through a door of a room. More precisely, as the designer generates or restores different designs 152, the designer remains in the same spot relative to the geometry of the room.

By contrast, a relative viewpoint 142 specifies a position and orientation for the designer relative to a virtual piece of furniture included in the room. Specifying a relative viewpoint 142 enables the designer to virtual experience different designs 154 from a task-specific vantage point, such as working at a desk, irrespective of the positions and orientations of the desk within the different designs 154. Advantageously, as the designer generates or restores different designs 152, the designer does not need to move any pieces of furniture (e.g., a desk) to "experience" the different room layouts from the task-specific vantage point.

The virtual reality application 140 configures the virtual reality input/output subsystem 180 to display the design image 154 in mid-air as part of the virtual reality environment. While the virtual reality input/output subsystem 180 displays the design image 154, the virtual reality application 140 receives feedback 160 from the virtual reality input/output subsystem 180. The feedback 160 includes, without limitation, data describing any number and type of movements and/or actions that the designer performs within the virtual reality environment. Notably, any movements are specified with respect to the design image 154 and, consequently, the associated design 152. Depending on the specified feedback 160, the virtual reality application 140 updates the viewpoint 142, generates and transmits new constraint data 162 to the generative design application 130, and/or generates and transmits new cue data 164 to the generative design application 130.

The virtual reality input/output subsystem 180 enables a designer to interact with the designs 152 via the virtual reality environment. More precisely, the virtual reality input/output subsystem 180 receives the design image 154 that depicts the current design 152, displays the design image 154, and generates the feedback 160 based on activities performed by the designer. The virtual reality input/output subsystem 180 may include any number and type of devices and implement any number and type of virtual reality and/or augmented reality techniques in any combination to display the design image 154 and monitor the activities of the designer.

For instance, in some embodiments, the virtual reality input/output subsystem 180 includes a head-mounted display (HMD) and two handheld wireless controllers that are tracked by the virtual reality input/output subsystem 180. Each of the controllers enables the designer to generate the feedback 160 via mid-air movements, buttons, triggers, and so forth.

For instance, in some embodiments, one of the controllers implements a "teleporting" paradigm in which the designer points to a position in the virtual reality environment and clicks a button to teleport to the position. To teleport the designer to the selected position, the virtual reality input/output subsystem 180 transmits the feedback 160 associated with the teleporting paradigm to the virtual reality application 140. Upon receiving the feedback 160, the virtual reality application 140 sets the viewpoint 142 to the selected position and a default orientation. The virtual reality application 140 then re-generates the design image 154 based on the current design 152 and the new viewpoint 142. Finally, the virtual reality application 140 transmits the new design image 154 to the virtual reality input/output subsystem 180.

In the same or other embodiments, one of the controllers implements a laser pointer paradigm in which the designer points a virtual laser point at a virtual object included in the virtual reality environment and clicks a button. In response, the virtual reality application 140 displays a context menu. The context menu is tailored to the selected virtual object and specifies the potential actions that can be performed on the associated virtual object. Notably, the virtual object may be any virtual object associated with the virtual reality environment, such as a virtual piece of furniture, a virtual wall, a virtual door, etc.

After accessing the context menu, the designer can perform any number of actions, such as defining a locking constraint or a grouping constraint. For example, to group two virtual pieces of furniture, the designer could select a command "group" from the context menu associated with one of the pieces of furniture and could then select the other virtual piece of furniture. Advantageously, by specifying desirable groups of furniture, the designer configures the generative design application 130 to generate the generative design space at a higher level of granularity that reflects the preferences of the designer.

In another example, the designer could select a command "edit clearance" from the context menu associated with a selected piece of furniture. The virtual reality application 140 would generate a clearance "handle" oriented in the direction in which the designer would approach the selected piece of furniture to use the selected piece of furniture. Subsequently, the designer could use the controller to grab the clearance handle and then drag the clearance handle outwards from the selected piece of furniture to specify the desired clearance distance.

In general, the virtual reality application 140 may implement any number and type of movement-based paradigms to enable the designer to generate new constraints. For instance, in some embodiments, the designer selects a path definition mode via a context menu associated with the room and then physically walks along a path to define a path constraint. Advantageously, because the designer is embedded in the design image 154, the designer can intuitively and efficiently specify constraints relative to the designer, the room, and any number of virtual objects within the room. In this fashion, the designer can specify any number and type of constraints based on the sense of the room that the designer obtains via the virtual reality environment.

In various embodiments, the virtual reality application 130 and/or the virtual reality input/output subsystem 150 may provide any number and type of components, widgets, and the like that enable the designer to provide the feedback 150 in any technically feasible fashion. For example, the virtual reality application 130 could enable the designer to request a new design 152 via a trigger in one of the controllers. In a similar fashion, the virtual reality application 130 could enable the designer to store the current design 152 via a button in one of the controllers. The virtual reality application 130 could provide a menu that enables the designer to restore a previously stored design 152 via a different button. In alternate embodiments, the virtual reality application 140 and/or the generative design application 130 may receive any amount and type of additional data in any technically feasible fashion. For instance, in some embodiments, the virtual reality application 140 may generate a supplemental graphical user interface (GUI) displayed via a 2D screen that enables the designer to restore previously generated designs 152.

Advantageously, the generative design subsystem 120 and the virtual reality input/output subsystem 180 reduce the time and effort required to generate new designs 152. In particular, embodying the designer in the designs 152 via a virtual reality environment enables the designer to efficiently specify constraints that guide the generative process. Embodying the designer in the 3D representations of the designs 152 also reduces the time and effort required for the designer to evaluate the designs 152 since the designer does not need to scrutinize 2D representations of the designs 152 in an attempt to imagine 3D representations of the designs 152. Further, because the generative algorithm 132 does not require an objective function, the generative design subsystem 120 can generate designs 152 when an objective function is unavailable.

After the designer has generated one or more designs 152 that satisfy the design goals, the generative design subsystem 120 transmits the current design 152 and/or any number of the stored designs 152 included in the design database 150 to another application or device. The transmitted design(s) 152 may then be used for production or further design activities.

For example, the designer could email multiple designs 152 to an interior designer as prototypes that demonstrate the preferences of the designer with respect to the layout of a room. The interior designer could then evaluate the prototypes, determine an objective function, execute a conventional generative algorithm based on the objective function, and then manually scrutinize the resulting generating design space to select a final design. In another example, the designer could select a single design 152 for implementation. The designer could then print a 2D image of the single design 152, provide the printout to a mover, and have the mover position and orient existing pieces of furniture as per the printout. In yet another example, the designer could import a single design 152 into a conventional 3D design tool, re-position and/or re-orient one or more virtual pieces of furniture, and then position and orient the physical pieces of furniture as per the modified design.

In alternate embodiments, the generative design subsystem 120 may generate designs 152 representing a layout of any number and type of objects digitally in any technically feasible fashion. For instance, in some embodiments, the generative design subsystem 120 could generate designs 152 that each represent a blueprint for a house. In such embodiments, the setup 122 could be modified to specify a geometry representing the foundation of the house instead of the room geometry and virtual objects representing building components, such as walls, instead of pieces of furniture. The layout rules implemented in the generative algorithm 134 could be modified in a complementary fashion. As a general matter, the techniques outlined herein are applicable to iteratively generating layout-based designs 152 based on constraints specified via mid-air representations of previously generated designs 152.

It will be appreciated that the design system 100 shown herein is illustrative and that variations and modifications are possible. For example the functionality provided by the generative design subsystem 120, the generative design application 130, the virtual reality application 140, and the virtual reality input/output subsystem 180 as described herein may be integrated into or distributed across any number of software applications (including one), and any number of components of the design system 100. Further, the connection topology between the various units in FIG. 1 may be modified as desired.

Interactively Exploring and Constraining a Generative Design Space

Figure 2:
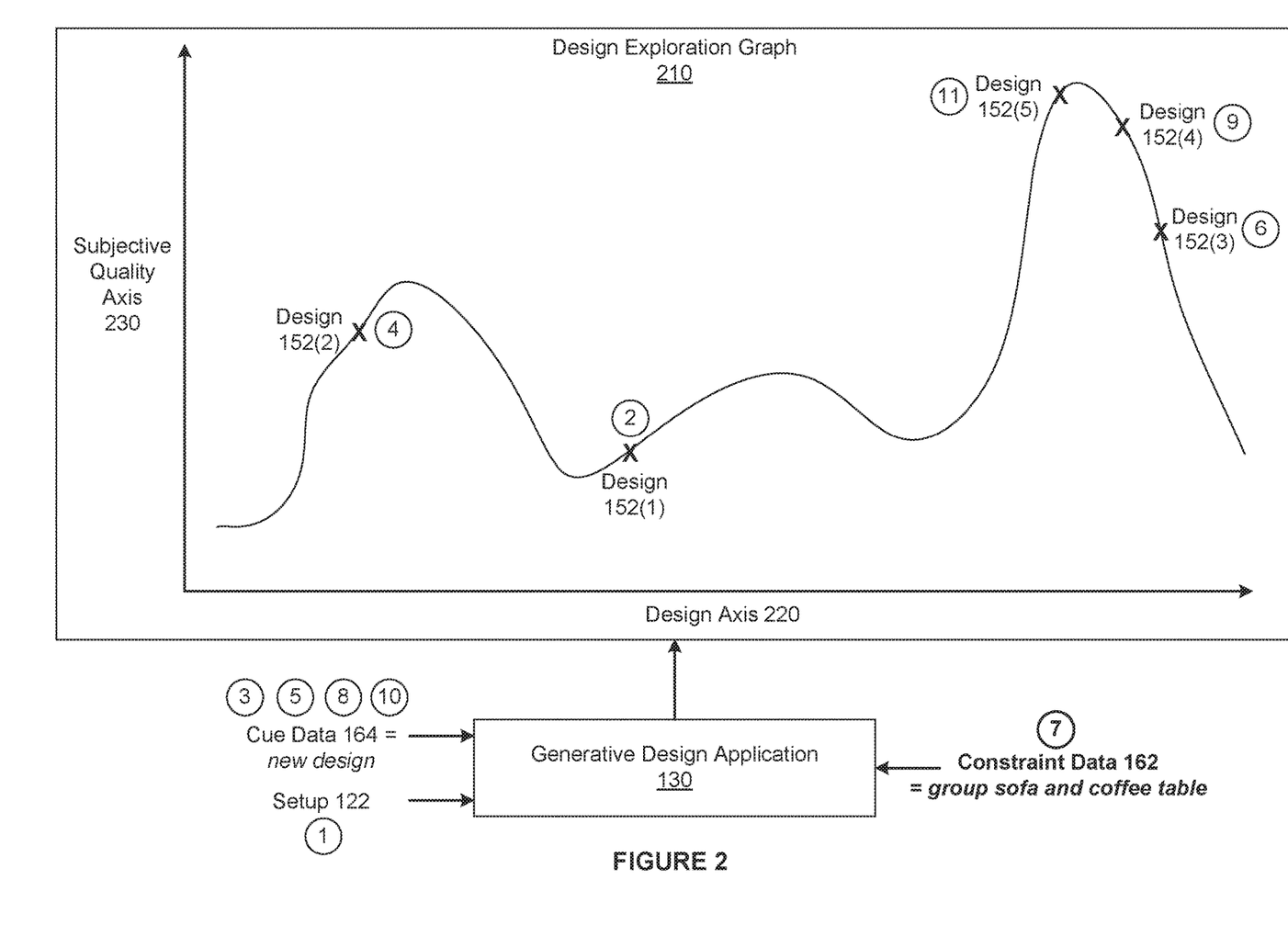
FIG. 2 illustrates a sequence of operations performed by the generative design application of FIG. 1 when generating a plurality of designs, according to various embodiments of the present invention.

FIG. 2 illustrates a sequence of operations performed by the generative design application 130 of FIG. 1 when generating a plurality of designs 152, according to various embodiments of the present invention. For explanatory purposes only, FIG. 2 depicts the designs 152(1)-152(5) that are generated by the generative design application in the context of a design exploration graph 210. Note that the design exploration graph 210 is a conceptual representation of the designs 152 and is neither generated nor displayed by the generative design subsystem 120. As shown, the design exploration graph 210 includes, without limitation, a design axis 220 and a subjective quality axis 230.

A sequence of inputs to and outputs from the generative design application 130 are depicted as a series of numbered bubbles. First, as depicted with the bubble numbered 1, the generative design application 130 acquires the setup 122 and sets the constraint set 134 equal to the initial constraint set 134. Subsequently (bubble number 2), the generative design application 130 generates the design 152(1) based on the setup 122 and the constraint set 134 (which is equal to the initial constraint set 134). As depicted, a subjective quality associated with the design 152(1) is relatively low. The designer does not identify any desirable features based on the design 152(1).

As depicted with the bubble numbered 3, the generative design application 130 receives the cue data 164 specifying that the generative design application 130 is to generate a new design 152. Subsequently and as depicted with the bubble numbered 4, the generative design application 130 generates the design 152(2) based on the setup 122 and the constraint set 134 (which is equal to the initial constraint set 134). As depicted, a subjective quality associated with the design 152(2) is higher than the subjective quality associated with the design 152(1). However, the designer does not identify any desirable features based on the design 152(2).

As depicted with the bubble numbered 5, the generative design application 130 receives the cue data 164 specifying that the generative design application 130 is to generate a new design 152. Subsequently and as depicted with the bubble numbered 6, the generative design application 130 generates the design 152(3) based on the setup 122 and the constraint set 134 (which is equal to the initial constraint set 134). As depicted, a subjective quality associated with the design 152(3) is higher than the subjective quality associated with the design 152(2). Further, the designer identifies that the relative positions and orientations of a sofa and a coffee table in the design 152(3) are a desirable feature and generates the feedback 160 grouping the sofa and the coffee table.

Consequently, as depicted with the bubble numbered 7, the generative design application 130 receives the constraint data 162 that specifies a grouping of the sofa and the coffee table. In response, the generative design application 130 adds a corresponding grouping constraint to the constraint set 134. As depicted with the bubble numbered 8, the generative design application 130 then receives the cue data 164 specifying that the generative design application 130 is to generate a new design 152.

As depicted with the bubble numbered 9, the generative design application 130 generates the design 152(4) based on the setup 122 and the constraint set 134 (which includes the single grouping constraint in addition to the constraints included in the initial constraint set 134). Because the design 152(4) includes the same group of sofa and coffee table as the design 152(3), the design 152(4) is relatively close to the design 152(3) in the generative design space and the subjective quality associated with the design 152(4) is relatively high.

As depicted with the bubble numbered 10, the generative design application 130 then receives the cue data 164 specifying that the generative design application 130 is to generate a new design 152. Finally, as depicted with the bubble numbered 11, the generative design application 130 generates the design 152(5) based on the setup 122 and the constraint set 134 (which includes the single grouping constraint in addition to the constraints included in the initial constraint set 134). Because the design 152(5) includes the same group of sofa and coffee table as the designs 152(3) and 152(4), the design 152(5) is relatively close to the designs 152(3) and 152(4) in the generative design space and the subjective quality associated with the design 152(5) is relatively high.

As FIG. 2 illustrates, the designer interactively explores and constrains the generative design space via the feedback 160. In particular, the designer configures the generative design application 130 to automatically generate the designs 152(1)-152(3) when in a high entropy state associated with the initial constraint set 134. After identifying a desirable feature, the designer configures the generative design application 130 to automatically generate the designs 152(4)-152(5) when in a low entropy state associated with the constraint set 134 that includes a grouping constraint in addition to the constraints included in the initial constraint set 134. As a result, the designs 152(4)-152(5) include the specified grouping of the sofa and the coffee table. Although not shown, the designer continues to specify additional constraints in this fashion until the generative design application 130 generates a design 152 having a satisfactory subjective quality.

Note that the designer could also remove constraints to increase the entropy associated with generative process and avoid a local maximum. For example, suppose that the designer decided that the grouping of the sofa and the coffee table was sub-optimal. The designer could remove the grouping constraint and explore the unconstrained generative design space via sequentially generated designs 152 until the generative design application 130 generated a design 152 having more desirable features. For example, a design 152 in which two armchairs were positioned and oriented in a desirable manner with respect to the coffee table and the sofa faced a television. The designer could then add two new grouping constraints to the constraint set 134 and continue to explore the newly constrained generative design space.

Figure 3A:
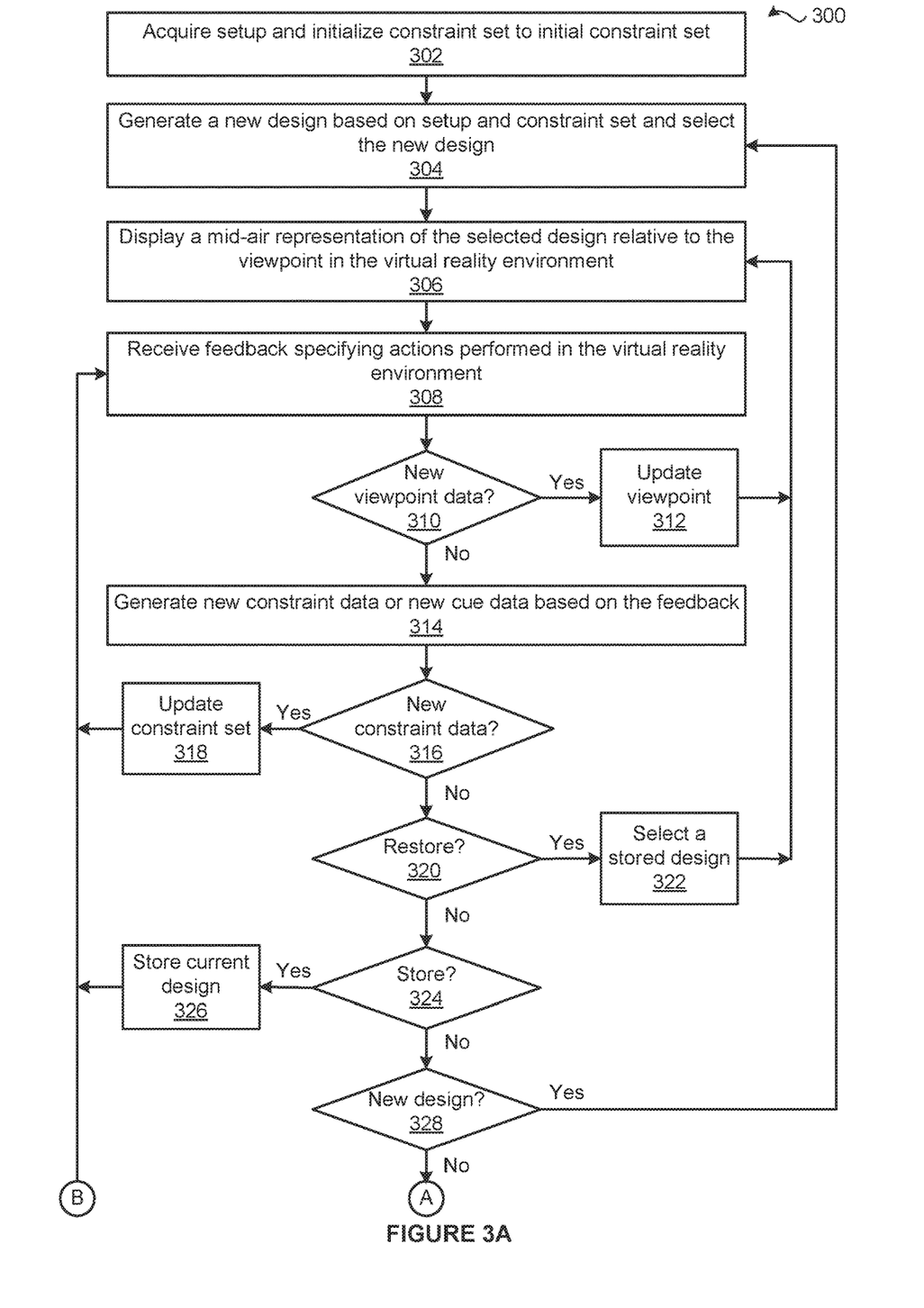
FIGS. 3A-3B set forth a flow diagram of method steps for iteratively generating designs via a generative design process, according to various embodiments of the present invention.
Figure 3B:
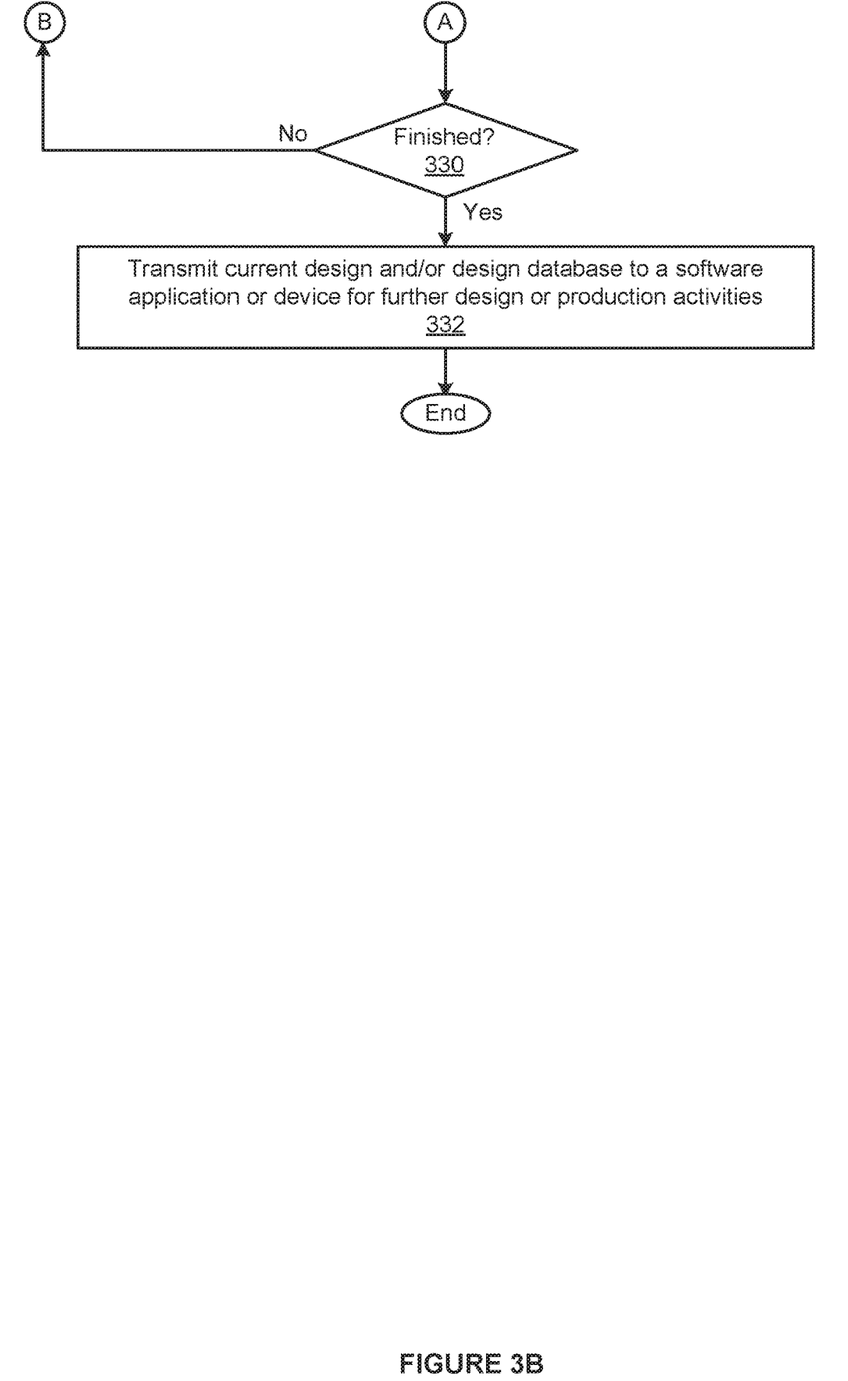

FIGS. 3A-3B set forth a flow diagram of method steps for iteratively generating designs via a generative design process, according to various embodiments of the present invention. Although the method steps are described with reference to the systems of FIGS. 1-2, persons skilled in the art will understand that any system configured to implement the method steps, in any order, falls within the scope of the present invention.

As shown, a method 300 begins at step 302, where the generative design application 130 acquires the setup 122 and initializes the constraint set 134 to the initial constraint set 134. At step 304, the generative algorithm 132 generates a new design 152 based on the setup 122 and the constraint set 134. The generative design application 130 then selects the new design 152.

At step 306, the virtual reality application 140 displays the selected design 152 in mid-air relative to the viewpoint 142 in the virtual reality environment. The virtual reality application 140 may display the selected design 152 in the virtual reality environment in any technically feasible fashion. For instance, in some embodiments, the virtual reality application 140 generates the design image 154 based on the selected design 152 and the viewpoint 142. The virtual reality application 140 then transmits the design image 154 to the virtual reality input/output subsystem 180.

At step 308, the virtual reality application 140 receives new feedback 160 specifying actions performed in the virtual reality environment from the virtual reality input/output subsystem 180. At step 310, the virtual reality application 140 determines whether the feedback 160 specifies a new viewpoint 142. If, at step 310, the virtual reality application 140 determines that the feedback 160 specifies a new viewpoint 142, then the method 300 proceeds to step 312. At step 312, the virtual reality application 140 updates the viewpoint 142 based on the new feedback 160. The method 300 then returns to step 306, where the virtual reality application 140 displays the selected design 152 in mid-air relative to the viewpoint 142.

If, however, at step 310, the virtual reality application 140 determines that the feedback 160 does not specify a new viewpoint 142, then the method 300 proceeds directly to step 314. At step 314, the virtual reality application 140 generates new constraint data 162 or new cue data 164 based on the feedback 160 and, subsequently, transmits the new constraint data 162 or the new cue data 164 to the generative design application 130.

At step 316, the generative design application 130 determines whether the generative design application 130 has received new constraint data 162. If, at step 316, the generative design application 130 determines that the generative design application 130 has received new constraint data 162, then the method 300 proceeds to step 318. At step 318, the generative design application 130 modifies the constraint set 134 based on the new constraint data 162. The method 300 then returns to step 308, where the virtual reality application 140 receives new feedback 160.

If, however, at step 316, the generative design application 130 determines that the generative design application 130 has not received new constraint data 162, then the method 300 proceeds directly to step 320. At step 320, the generative design application 130 determines whether the new cue data 164 specifies that a previously stored design 152 is to be restored. If, at step 320, the generative design application 130 determines that the new cue data 164 specifies that a previously stored design 152 is to be restored, then the method 300 proceeds to step 322. At step 322, the generative design application 130 selects one of the designs 152 included in the design database 150 based on the new cue data 164 and transmits the selected design 152 to the virtual reality application 140. The method 300 then returns to step 306, where the virtual reality application 140 displays the selected design 152 in mid-air.

If, however, at step 320, the generative design application 130 determines that the new cue data 164 does not specify that a previously stored design 152 is to be restored, then the method 300 proceeds directly to step 324. At step 324, the generative design application 130 determines whether the new cue data 164 specifies that the current design 152 is to be stored. If, at step 324, the generative design application 130 determines that the new cue data 164 specifies that the current design 152 is to be stored, then the method 300 proceeds to step 326. At step 326, the generative design application 130 stores the current design 152 in the design database 150. The method 300 then returns to step 308, where the virtual reality application 140 receives new feedback 160.

If, however, at step 324, the generative design application 130 determines that the new cue data 164 does not specify that the current design 152 is to be stored, then the method 300 proceeds directly to step 328. At step 328, the generative design application 130 determines whether the new cue data 164 specifies that the generative design application 130 is to generate a new design 152. If, at step 328, the generative design application 130 determines that the new cue data 164 specifies that the generative design application 130 is to generate a new design 152, then the method 300 returns to step 304, where the generative design application 130 generates and selects a new design 152.

If, however, at step 328, the generative design application 130 determines that the new cue data 164 does not specify that the generative design application 130 is to generate a new design 152, then the method 300 proceeds to step 330.

At step 330, the generative design application 130 determines whether the new cue data 164 specifies that the current design activity is finished. If, at step 330, the generative design application 130 determines that the new cue data 164 specifies that the current design activity is not finished, then the method 300 returns to step 308, where the virtual reality application 140 receives new feedback 160.

If, however, at step 330, the generative design application 130 determines that the new cue data 164 specifies that the current design activity is finished, then the method 300 proceeds to step 332. At step 332, the generative design application 130 transmits the design database 152 to a software application or device (e.g., another design application, a printer, a 3D printer, etc) for further design or production activities. The method 300 then terminates.

In sum, the disclosed techniques may be used to efficiently generate designs. In some embodiments, a generative design application generates designs on-demand based on a setup and a constraint set that changes over time. After the generative design application generates a new design, a virtual reality application generates a design image based on the new design and a viewpoint. The virtual reality application then displays the design image in a virtual reality environment. Subsequently, the virtual reality application receives feedback from activities performed by a designer within the virtual reality environment. The feedback may specify any number and type of constraints or any number and type of requests. Examples of constraints include, without limitation, path constraints, locking constraints, grouping constraints, and clearance constraints. Examples of requests include, without limitation, saving the displayed design, displaying a previously saved design from the viewpoint, changing the viewpoint, and generating a new design. The virtual reality application and/or the generative design application process the feedback and, as applicable, update the constraint set, re-generate the design, and/or re-generate the design image.

Advantageously, by automatically generating new designs based on constraints specified relative to mid-air representations of previously generated designs in a virtual reality environment, the generative design application addresses various drawbacks of prior art generative design techniques. In particular, enabling the designer to incrementally specify design goals as subjective constraints via mid-air movements in the virtual reality environment instead of as a predetermined objective function reduces both the time and effort required for the designer to define the design goals. Further, embedding the designer within different designs in the virtual reality environment while fixing the point-of-view to a particular object enables the designer to rapidly determine desirable features for specific tasks. These technical advantages provide one or more technological advancements over the prior art.

1. In some embodiments, a computer-implemented method for iteratively generating designs via a generative design process comprises performing one or more layout operations on a plurality of virtual objects based on a first set of design constraints to generate a first design; modifying the first set of design constraints based on feedback associated with a mid-air representation of the first design displayed in a virtual reality environment to generate a second set of design constraints; and performing one or more layout operations on the plurality of virtual objects based on the second set of design constraints to generate a second design that achieves one or more design goals.

2. The computer-implemented method of clause 1, wherein modifying the first set of designs constraints comprises generating one or more design constraints based on a path specified in the feedback associated with the mid-air representation; and adding the one or more design constraints to the first set of design constraints to generate the second set of design constraints.

3. The computer-implemented method of clause 1 or 2, further comprising generating a first image based on the second design and a relative viewpoint associated with a first virtual object included in the plurality of virtual objects; configuring a display system to display the first image in mid-air in the virtual reality environment; generating a second image based on the first design and the relative viewpoint in response to a command to restore the first design; and configuring the display system to display the second image in mid-air in the virtual reality environment instead of the first image.

4. The computer-implemented method of any of clauses 1-3, further comprising generating a first image based on the second design and an absolute viewpoint that specifies a position and an orientation; displaying the first image in the virtual reality environment; generating a second image based on the first design and the absolute viewpoint in response to a command to restore the first design; and displaying the second image in the virtual reality environment instead of the first image.

5. The computer-implemented method of any of clauses 1-4, wherein the feedback comprises one or more movements that define a fixed position for a first virtual object included in the plurality of virtual objects.

6. The computer-implemented method of any of clauses 1-5, wherein the feedback specifies a score associated with a position of at least one virtual object included in the plurality of virtual objects.

7. The computer-implemented method of any of clauses 1-6, wherein the feedback comprises one or more movements that define a clearance associated with a first virtual object included in the plurality of virtual objects.

8. The computer-implemented method of any of clauses 1-7, wherein performing the layout operations comprises executing a real-time generative design algorithm.

9. The computer-implemented method of any of clauses 1-8, wherein the first design specifies at least one of one or more positions and one or more orientations of pieces of furniture within a room.

10. In some embodiments, one or more non-transitory computer readable media include instructions that, when executed by one or more processors, cause the one or more processors to iteratively generate designs via a generative design process by performing the steps of performing one or more layout operations on a plurality of virtual objects based on a first set of design constraints to generate a first design; modifying the first set of design constraints based on feedback associated with a mid-air representation of the first design displayed in a virtual reality environment to generate a second set of design constraints; and performing one or more layout operations on the plurality of virtual objects based on the second set of design constraints to generate a second design that achieves one or more design goals.

11. The one or more non-transitory computer readable media of clause 10, wherein modifying the first set of designs constraints comprises generating one or more design constraints based on a path specified in the feedback associated with the mid-air representation; and adding the one or more design constraints to the first set of design constraints to generate the second set of design constraints.

12. The one or more non-transitory computer readable media of clause 10 or 11, further comprising generating a first image based on the second design and a relative viewpoint associated with a first virtual object included in the plurality of virtual objects; configuring a display system to display the first image in mid-air in the virtual reality environment; generating a second image based on the first design and the relative viewpoint in response to a command to restore the first design; and configuring the display system to display the second image in mid-air in the virtual reality environment instead of the first image.

13. The one or more non-transitory computer readable media of any of clauses 10-12, further comprising generating a first image based on the second design and an absolute viewpoint that specifies a position and an orientation; displaying the first image in the virtual reality environment; generating a second image based on the first design and the absolute viewpoint in response to a command to restore the first design; and displaying the second image in the virtual reality environment instead of the first image.

14. The one or more non-transitory computer readable media of any of clauses 10-13, wherein the feedback comprises one or more movements that define a grouping of two or more virtual objects included in the plurality of virtual objects.

15. The one or more non-transitory computer readable media of any of clauses 10-14, wherein the feedback specifies a score associated with a position of at least one virtual object included in the plurality of virtual objects.

16. The one or more non-transitory computer readable media of any of clauses 10-15, wherein the feedback comprises one or more movements that define a boundary for positioning at least one virtual object included in the plurality of virtual objects.

17. The one or more non-transitory computer readable media of any of clauses 10-16, wherein performing the layout operations comprises executing a real-time generative design algorithm.

18. The one or more non-transitory computer readable media of any of clauses 10-17, wherein the plurality of virtual objects represents various pieces of furniture that are to be placed in a room, and the first design comprises a room layout.

19. In some embodiments, a system comprises one or more memories storing instructions; and one or more processors that are coupled to the one or more memories and, when executing the instructions, are configured to perform one or more layout operations on a plurality of virtual objects based on a first set of design constraints to generate a first design; modify the first set of design constraints based on feedback associated with a mid-air representation of the first design displayed in a virtual reality environment to generate a second set of design constraints; and perform one or more layout operations on the plurality of virtual objects based on the second set of design constraints to generate a second design that achieves one or more design goals.

20. The system of clause 19, wherein the one or more processors are further configured to generate a first image based on the second design and a relative viewpoint associated with a first virtual object included in the plurality of virtual objects; configure a display system to display the first image in mid-air in the virtual reality environment; generate a second image based on the first design and the relative viewpoint in response to a command to restore the first design; and configure the display system to display the second image in mid-air in the virtual reality environment instead of the first image.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for iteratively generating designs via a generative design process, the method comprising:
    performing one or more layout operations on a plurality of virtual objects based on a first set of design constraints to generate a first design;
    generating at least one additional design constraint based on feedback associated with one or more user interactions with a mid-air representation of the first design displayed in a virtual reality environment, wherein the feedback comprises data describing the one or more user interactions with the mid-air representation of the first design; and
    performing one or more layout operations on the plurality of virtual objects based on the at least one additional design constraint and the first set of design constraints to generate a second design that achieves one or more design goals.

2. The computer-implemented method of claim 1, wherein generating the at least one additional design constraint comprises:
    generating one or more additional design constraints based on a path specified in the feedback associated with one or more user interactions with the mid-air representation.

3. The computer-implemented method of claim 1, further comprising:
    generating a first image based on the second design and a relative viewpoint associated with a first virtual object included in the plurality of virtual objects;
    configuring a display system to display the first image in mid-air in the virtual reality environment;
    generating a second image based on the first design and the relative viewpoint in response to a command to restore the first design; and
    configuring the display system to display the second image in mid-air in the virtual reality environment instead of the first image.

4. The computer-implemented method of claim 1, further comprising:
    generating a first image based on the second design and an absolute viewpoint that specifies a position and an orientation;
    displaying the first image in the virtual reality environment;
    generating a second image based on the first design and the absolute viewpoint in response to a command to restore the first design; and
    displaying the second image in the virtual reality environment instead of the first image.

5. The computer-implemented method of claim 1, wherein the feedback comprises one or more movements that define a fixed position for a first virtual object included in the plurality of virtual objects.

6. The computer-implemented method of claim 1, wherein the feedback specifies a score associated with a position of at least one virtual object included in the plurality of virtual objects.

7. The computer-implemented method of claim 1, wherein the feedback comprises one or more movements that define a clearance associated with a first virtual object included in the plurality of virtual objects.

8. The computer-implemented method of claim 1, wherein performing the layout operations comprises executing a real-time generative design algorithm.

9. The computer-implemented method of claim 1, wherein the first design specifies at least one of one or more positions and one or more orientations of pieces of furniture within a room.

10. One or more non-transitory computer readable media including instructions that, when executed by one or more processors, cause the one or more processors to iteratively generate designs via a generative design process by performing the steps of:
    performing one or more layout operations on a plurality of virtual objects based on a first set of design constraints to generate a first design;
    generating at least one additional design constraint based on feedback associated with one or more user interactions with a mid-air representation of the first design displayed in a virtual reality environment, wherein the feedback comprises data describing the one or more user interactions with the mid-air representation of the first design; and
    performing one or more layout operations on the plurality of virtual objects based on the at least one additional design constraint and the first set of design constraints to generate a second design that achieves one or more design goals.

11. The one or more non-transitory computer readable media of claim 10, wherein generating the at least one additional design constraint comprises:
    generating one or more additional design constraints based on a path specified in the feedback associated with one or more user interactions with the mid-air representation.

12. The one or more non-transitory computer readable media of claim 10, further comprising:
    generating a first image based on the second design and a relative viewpoint associated with a first virtual object included in the plurality of virtual objects;
    configuring a display system to display the first image in mid-air in the virtual reality environment;
    generating a second image based on the first design and the relative viewpoint in response to a command to restore the first design; and
    configuring the display system to display the second image in mid-air in the virtual reality environment instead of the first image.

13. The one or more non-transitory computer readable media of claim 10, further comprising:

generating a first image based on the second design and an absolute viewpoint that specifies a position and an orientation;

displaying the first image in the virtual reality environment;

generating a second image based on the first design and the absolute viewpoint in response to a command to restore the first design; and displaying the second image in the virtual reality environment instead of the first image.

14. The one or more non-transitory computer readable media of claim 10, wherein the feedback comprises one or more movements that define a grouping of two or more virtual objects included in the plurality of virtual objects.

15. The one or more non-transitory computer readable media of claim 10, wherein the feedback specifies a score associated with a position of at least one virtual object included in the plurality of virtual objects.

16. The one or more non-transitory computer readable media of claim 10, wherein the feedback comprises one or more movements that define a boundary for positioning at least one virtual object included in the plurality of virtual objects.

17. The one or more non-transitory computer readable media of claim 10, wherein performing the layout operations comprises executing a real-time generative design algorithm.

18. The one or more non-transitory computer readable media of claim 10, wherein the plurality of virtual objects represents various pieces of furniture that are to be placed in a room, and the first design comprises a room layout.

19. A system, comprising:
one or more memories storing instructions; and
one or more processors that are coupled to the one or more memories and, when executing the instructions, are configured to:
  perform one or more layout operations on a plurality of virtual objects based on a first set of design constraints to generate a first design;
  generate at least one additional design constraint based on feedback associated with one or more user interactions with a mid-air representation of the first design displayed in a virtual reality environment, wherein the feedback comprises data describing the one or more user interactions with the mid-air representation of the first design; and
  perform one or more layout operations on the plurality of virtual objects based on the at least one additional design constraint and the first set of design constraints to generate a second design that achieves one or more design goals.

20. The system of claim 19, wherein the one or more processors are further configured to:
  generate a first image based on the second design and a relative viewpoint associated with a first virtual object included in the plurality of virtual objects;
  configure a display system to display the first image in mid-air in the virtual reality environment;
  generate a second image based on the first design and the relative viewpoint in response to a command to restore the first design; and
  configure the display system to display the second image in mid-air in the virtual reality environment instead of the first image.

* * * * *